(12) United States Patent
Kim et al.

(10) Patent No.: US 9,425,352 B2
(45) Date of Patent: Aug. 23, 2016

(54) SEMICONDUCTOR DEVICE, LIGHT EMITTING DEVICE AND METHOD OF MANUFACTURING SAME

(75) Inventors: Yong Jin Kim, Gumi-si (KR); Dong Kun Lee, Gumi-si (KR); Doo Soo Kim, Gyeongbuk (KR)

(73) Assignee: LG Siltron Inc. (KR)

( * ) Notice: Subject to any disclaimer, the term of this patent is extended or adjusted under 35 U.S.C. 154(b) by 578 days.

(21) Appl. No.: 13/057,136

(22) PCT Filed: Jul. 29, 2009

(86) PCT No.: PCT/KR2009/004215
§ 371 (c)(1),
(2), (4) Date: Sep. 19, 2011

(87) PCT Pub. No.: WO2010/013936
PCT Pub. Date: Feb. 4, 2010

(65) Prior Publication Data
US 2011/0315996 A1 Dec. 29, 2011

(30) Foreign Application Priority Data
Aug. 1, 2008 (KR) .................. 10-2008-0075493

(51) Int. Cl.
*H01L 33/12* (2010.01)
*H01L 21/02* (2006.01)
(Continued)

(52) U.S. Cl.
CPC .......... *H01L 33/12* (2013.01); *H01L 21/0237* (2013.01); *H01L 21/0254* (2013.01); *H01L 21/0262* (2013.01); *H01L 21/02488* (2013.01); *H01L 21/02491* (2013.01);
(Continued)

(58) Field of Classification Search
CPC ..... H01L 33/08; H01L 33/18; H01L 33/007; H01L 21/0237; H01L 27/153; H01L 33/0079; B82Y 20/00; H01S 5/32341
USPC ................... 257/79–99; 438/22–47; 362/612
See application file for complete search history.

(56) References Cited

U.S. PATENT DOCUMENTS 6,504,180 B1 1/2003 Heremans et al.
7,202,173 B2 4/2007 Hantschel
(Continued)

FOREIGN PATENT DOCUMENTS

CN 1881630 12/2006
CN 1983657 A 6/2007
(Continued)

OTHER PUBLICATIONS

Chinese Application No. CN 200980130443.X, Office Action dated Mar. 8, 2013.
(Continued)

*Primary Examiner* — Jerome Jackson, Jr.
*Assistant Examiner* — Fang-Xing Jiang
(74) *Attorney, Agent, or Firm* — Lewis Roca Rothgerber Chrisite LLP

(57) ABSTRACT

Disclosed are a semiconductor device, a light emitting device, and a method of manufacturing the same. The semiconductor device includes a substrate, a plurality of rods aligned on the substrate, a metal layer disposed on the substrate between the rods, and a semiconductor layer disposed on and between the rods. Electrical and optical characteristics of the semiconductor device are improved due to the metal layer.

10 Claims, 3 Drawing Sheets

(51) Int. Cl.
*H01L 21/308* (2006.01)
*H01L 33/00* (2010.01)
*H01L 33/38* (2010.01)

(52) U.S. Cl.
CPC .. *H01L 21/02513* (2013.01); *H01L 21/02573* (2013.01); *H01L 21/02581* (2013.01); *H01L 21/02658* (2013.01); *H01L 21/3081* (2013.01); *H01L 33/007* (2013.01); *H01L 33/382* (2013.01)

(56) References Cited

U.S. PATENT DOCUMENTS

| | | | |
|---|---|---|---|
| 7,947,989 B2 | 5/2011 | Ha | |
| 8,008,646 B2 | 8/2011 | Leem | |
| 8,383,493 B2 | 2/2013 | Wang | |
| 2002/0046693 A1 | 4/2002 | Kiyoku et al. | |
| 2002/0050561 A1 | 5/2002 | Heremans et al. | |
| 2005/0062049 A1* | 3/2005 | Lin et al. | 257/79 |
| 2006/0091408 A1 | 5/2006 | Kim et al. | |
| 2006/0286697 A1* | 12/2006 | Leem | 438/27 |
| 2007/0041214 A1* | 2/2007 | Ha et al. | 362/612 |
| 2007/0126013 A1* | 6/2007 | Kim | H01L 33/08 257/91 |
| 2007/0166862 A1* | 7/2007 | Kim | H01L 33/0079 438/42 |
| 2008/0142824 A1 | 6/2008 | Chen et al. | |
| 2009/0148982 A1 | 6/2009 | Yi | |
| 2009/0169828 A1* | 7/2009 | Hersee | B82Y 20/00 428/172 |
| 2009/0246901 A1* | 10/2009 | Gilet et al. | 438/29 |
| 2010/0327258 A1* | 12/2010 | Lee | H01L 21/0237 257/14 |
| 2012/0164767 A1* | 6/2012 | Gasse | H01L 27/153 438/27 |

FOREIGN PATENT DOCUMENTS

| | | |
|---|---|---|
| EP | 1 059 661 | 12/2000 |
| GB | 2 441 705 | 3/2008 |
| JP | 2000-091628 | 3/2000 |
| JP | 2001-144321 | 5/2001 |
| JP | 2001-339100 | 12/2001 |
| JP | 2003-188324 | 7/2003 |
| JP | 2005-051173 | 2/2005 |
| JP | 2006-128627 | 5/2006 |
| JP | 2006-148087 | 6/2006 |
| JP | 2007-187857 | 7/2006 |
| JP | 2006-253628 | 9/2006 |
| JP | 2006-332650 | 12/2006 |
| JP | 2006-352129 | 12/2006 |
| JP | 2007-123398 | 5/2007 |
| JP | 2007-168066 | 7/2007 |
| JP | 2008-108757 | 5/2008 |
| JP | 2008-166567 | 7/2008 |
| JP | 2009-009978 | 1/2009 |
| JP | 2010-518615 | 5/2010 |

OTHER PUBLICATIONS

Chinese Office Action for CN 200980130443.X dated Jul. 4, 2012.

Japanese Application No. 2011-521022, Office Action dated Dec. 4, 2012.

Japanese Application No. 2011-521022, Notice of Allowance dated Jun. 18, 2013.

European Application No. EP 09803141.2, Extended European Search Report dated Jul. 1, 2014.

Chinese Application No. CN 200980130443.X Notice of Allowance dated May 11, 2015.

* cited by examiner (a)

(b)

SEMICONDUCTOR DEVICE, LIGHT EMITTING DEVICE AND METHOD OF MANUFACTURING SAME

TECHNICAL FIELD

The embodiment relates to a semiconductor device, a light emitting device and a method of manufacturing the same.

BACKGROUND ART

Nitride gallium (GaN) is generally known as a compound semiconductor material suitable for blue light emitting devices or high-temperature electronic devices. Recently, the blue light emitting devices have been extensively used, so demands for GaN substrates have been increased. However, high-quality GaN substrates may not be easily manufactured, so that the manufacturing cost and the manufacturing time for the GaN substrates may be increased.

Different from silicon or sapphire, the GaN cannot be grown in the form of an ingot, so an epitaxial growth method is adopted to grow the GaN on a heterogeneous substrate, such as a SiC substrate or a sapphire substrate. Since there is difference in lattice constant and thermal expansion coefficient between the heterogeneous substrate and GaN crystal, dislocation density becomes high so that characteristics of devices employing the GaN substrate may be degraded and various problems may occur when manufacturing the devices.

In order to reduce the problems, the manufacturing process is complicated and the manufacturing time is increased. In the case of the ELO (epitaxial lateral overgrowth), which is extensively used to manufacture the high-quality GaN substrate, the stress caused by difference in lattice constant and thermal expansion coefficient between the substrate and GaN crystal is blocked by using a $SiO_2$ mask having a stripe pattern. That is, according to the ELO scheme, after growing the GaN layer on the substrate, the substrate having the GaN layer is unloaded from a reactor and then the substrate is loaded into deposition equipment to deposit a $SiO_2$ layer on the GaN layer. Then, the substrate having the $SiO_2$ layer is unloaded from the deposition equipment and a $SiO_2$ mask pattern is formed on the substrate through a photolithography process. Then, the substrate is again loaded into the reactor to complete the formation of the GaN layer (see Korean Patent Publication No. 455277). However, such an ELO scheme is very complicated, so that the process time is lengthened and reproducibility and the product yield are lowered.

Meanwhile, the light emitting device employing the compound semiconductor must have improved light emitting efficiency and reduced power consumption. That is, light emitted from an active layer of the light emitting device is guided toward a surface of the light emitting device as well as the substrate, so that the light is absorbed in the substrate, resulting in degradation of the light emitting efficiency. In order to solve this problem, a patterned sapphire substrate having a fine surface is employed to scatter the light guided toward the substrate in such a manner that the amount of light absorbed in the substrate can be reduced while increasing the amount of light guided toward the surface of the light emitting device. However, complicated processes and long process time are required in order to process the substrate having the fine surface.

Instead of the SiC substrate and the sapphire substrate, a low-priced silicon wafer having a large diameter can be used as a base substrate for the GaN growth. However, since there is greater difference in lattice constant and thermal expansion coefficient between the silicon substrate and the GaN crystal, the high-quality GaN substrate may not be obtained. In addition, the light emitted from the active layer of the light emitting device is absorbed in the silicon substrate due to the low band gap energy and opaque property of the silicon, so that the light emitting efficiency may be lowered.

As mentioned above, expensive and complicated processes, such as the photolithography process, are required to manufacture the high-quality compound semiconductor substrate having reduced crystal defect. In addition, although the expensive and complicated processes are performed to reduce the power consumption, the reproducibility and the product yield are still lowered.

DISCLOSURE

Technical Problem

The embodiment provides a semiconductor device and a light emitting device, which can be simply manufactured at the low cost with high quality and high efficiency.

Technical Solution

According to the embodiment, there is provided a semiconductor device including a substrate; a plurality of rods aligned on the substrate; a metal layer disposed on the substrate between the rods; and a semiconductor layer disposed on and between the rods.

According to the embodiment, there is provided a light emitting device including a substrate; a plurality of rods aligned on the substrate while being spaced apart from each other; a metal layer disposed on the substrate between the rods; a first conductive type semiconductor layer disposed on and between the rods; an active layer disposed on the first conductive type semiconductor layer; and a second conductive type semiconductor layer disposed on the active layer.

According to the embodiment, there is provided a method of manufacturing a semiconductor device, the method including preparing a substrate; disposing a plurality of particles on the substrate; forming a plurality of rods by etching a part of the substrate using the particles as a mask; forming metal layer between the rods; and forming a first semiconductor layer on and between the rods.

Advantageous Effects

According to the method of manufacturing the semiconductor device of the embodiment, the substrate, in more detail, the semiconductor layer formed on the support substrate is etched by using a mask including particles, such as silicon oxide balls, thereby forming a plurality of rods.

In addition, according to the method of manufacturing the semiconductor device of the embodiment, the metal layer is deposited between the rods, and then the semiconductor layer is grown from the lateral sides of the semiconductor rods exposed above the metal layer.

Therefore, different from the conventional ELO scheme employing the photolithography process, the method of manufacturing the semiconductor device according to the embodiment can easily manufacture the high-quality semiconductor device at the low cost with higher reproducibility and product yield.

In addition, according to the semiconductor device and the light emitting device of the embodiment, resistance of the semiconductor layer can be reduced and the electric characteristics of the semiconductor layer can be improved due to the metal layer.

Further, since the metal layer serves as a reflective layer, the light emitting efficiency of the light emitting device according to the embodiment can be improved.

In addition, since the contact area between the rods and the substrate can be reduced, the defect of the semiconductor layer of the semiconductor device or the light emitting device can be reduced.

That is, the rods serve as buffers to compensate for crystallographic difference between the substrate and the semiconductor layer. Thus, the crystal defect of the semiconductor device and the light emitting device according to the embodiment can be reduced.

The semiconductor device and the light emitting device according to the embodiment have improved performance and can be easily manufactured.

MODE FOR INVENTION

Figure 1:
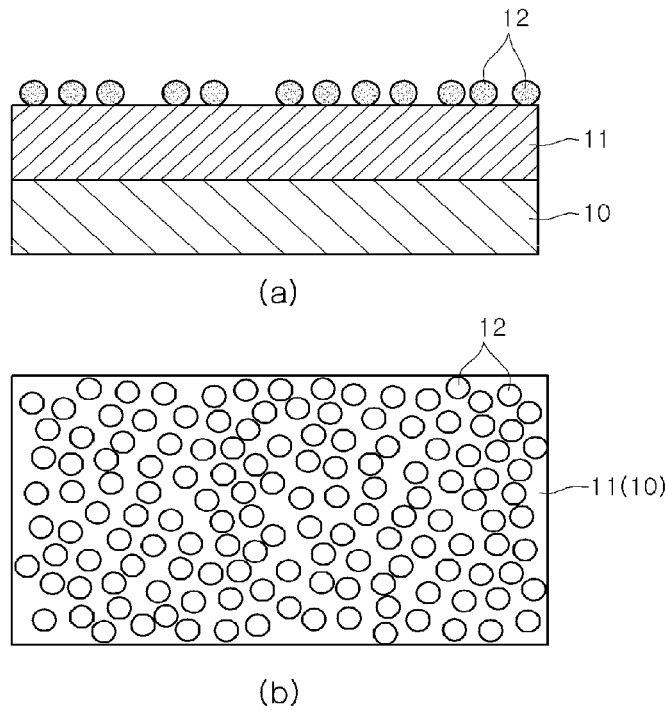
FIGS. 1 to 5 are sectional views showing a method of manufacturing a semiconductor light emitting device according to an embodiment.

In the description of an embodiment, it will be understood that when a substrate, a rod, a layer, a particle or an electrode is referred to being "on" or "under" another substrate, another rod, another layer, another particle or another electrode, it can be "directly" or "indirectly" on the other substrate, rod, layer, particle or electrode, or one or more intervening substrate, rod, layer, particle or electrode may be also be present. Further, the meaning of "on" or "region" must be determined based on the accompanying drawings. The thickness and size of some components shown in the drawings can be exaggerated. In addition, the size of each component does not utterly reflect an actual size.

FIGS. 1 to 5 are sectional views showing a method of manufacturing a semiconductor light emitting device according to an embodiment, in which FIG. 1(b) is a plan view of FIG. 1(a).

Referring to FIG. 1, a first compound semiconductor layer 11 is grown on a substrate 10, and particles 12 are coated on the first compound semiconductor layer 11. The substrate 10 is a support substrate to support the first compound semiconductor layer 11. The substrate 10 may include sapphire ($Al_2O_3$), GaAs, spinel, InP, SiC or Si. The above materials have advantages as described below, so it is possible to properly select the above materials according to applications or purposes. The sapphire substrate has stability at the high temperature, but the sapphire substrate has a small size, so the sapphire substrate is not suitable for manufacturing a large-size semiconductor device. The crystal structure of the SiC is identical to that of the GaN, which is a representative nitride semiconductor, and the SiC substrate is stable at the high temperature. In addition, the lattice constant and the thermal expansion coefficient of the SiC are similar to those of the GaN, but the SiC is expensive. The silicon substrate represents relatively great difference in lattice constant and the thermal expansion coefficient with respect to the GaN, but the silicon substrate can be used for manufacturing the semiconductor device having a large size of 12-inches or more, so that the manufacturing cost can be reduced and the semiconductor device suitable for various applications can be manufactured.

The first compound semiconductor layer 11 grown on the substrate 10 is to form semiconductor rods 20, which will be described later in detail. Preferably, the first compound semiconductor layer 11 includes the material similar to or the same as the material for a second compound semiconductor layer 40, which will be described later in detail. In this case, the method of growing the first compound semiconductor layer 11 shown in FIG. 1 is substantially identical to the method of growing the second compound semiconductor layer 40 shown in FIG. 4, so the following description will be focused on the method of growing the first compound semiconductor layer 11 shown in FIG. 1 and the method of growing the second compound semiconductor layer 40 shown in FIG. 4 will be omitted in order to avoid redundancy.

Although not shown in the drawings, a buffer layer can be formed in order to reduce crystallographic difference between the substrate 10 and the first compound semiconductor layer 11 such that density of the crystal defect can be minimized. Preferably, the buffer layer includes the material having crystal properties identical to those of the first compound semiconductor layer 11 such that chemical stabilization can be achieved. In detail, the buffer layer preferably includes the material having the crystal structure, lattice constant and thermal expansion coefficient similar to or the same as those of the first compound semiconductor layer 11, which will be formed subsequently to the buffer layer. More preferably, the buffer layer includes the material having the crystal structure identical to that of the first compound semiconductor layer 11 and representing difference in lattice constant relative to the first compound semiconductor layer 11 within a range of less than 20%.

In more detail, when the first compound semiconductor layer 11 includes a nitride-based compound semiconductor, the buffer layer may be prepared as a single layer or a multiple layer by using a GaN layer, an AN layer, an AlGaN layer and a combination thereof. In general, the buffer layer is formed through an MOCVD (metal organic chemical vapor deposition), in which reactive precursors are injected into a reactor through individual lines at a predetermined flow rate and the reactor is maintained with predetermined pressure and temperature such that the reactive precursors are subject to chemical reaction, thereby forming the buffer layer having desired thickness. In this case, the reactive precursors may include trimethyl aluminum (TMAl), trimethyl gallium (TMGa), triethyl gallium (TEGa) or $GaCl_3$. In addition, ammonia ($NH_3$), nitrogen, or tertiarybutylamine ($N(C_4H_9)H_2$) can be used as source gas. In the case of the low-temperature GaN buffer layer, the buffer layer is grown at the temperature range of about 400 to 800° C. until the buffer layer has the thickness of about 10 to 40 nm. In the case of the AlN buffer layer or AlGaN buffer layer, the buffer layer is grown at the temperature range of about 400 to 1200° C. until the buffer layer has the thickness of about 10 to 200 nm. The buffer layers can be selectively used according to the substrate, growth equipment (MOCVD equipment), and growth conditions.

Then, the first compound semiconductor layer 11 is grown on the substrate formed with the buffer layer. The first compound semiconductor layer 11 may include the III-V group compound semiconductor or the IT-VT group compound semiconductor, which can emit light of ultraviolet band, visible band or infrared band. If the nitride-based compound semiconductor is used for the first compound semiconductor layer 11, GaN, InN, AlN, InGaN, AlGaN, AlInN, or AlInGaN (expressed as $Al_XIn_YGa_ZN$, wherein $0 \leq X \leq 1$, $0 \leq Y \leq 1$ and $0 \leq Z \leq 1$) can be used. The GaN is a direct-transition type wide band gap semiconductor having band gap energy of 3.4 eV and is known as a material suitable for a blue light emitting device or a high-temperature electronic device. When the first compound semiconductor layer 11 is deposited, indium (In) and aluminum (Al) are individually, simultaneously, or sequentially injected to grow an InN layer, an AlN layer, an InGaN layer, an AlGaN layer, an AlInN layer, or an AlInGaN layer such that the band gap of the device can be adjusted in the range of 1.9 to 6.2 eV. The GaN layer has the band gap of 3.4 eV, the AlN layer has the band gap of 6.2 eV, and the InN layer has the band gap of 0.7 eV. Since the AlN layer has the band gap of 6.2 eV, the AlN can emit light of the ultraviolet band. Although the $Al_XGa_{1-X}N$ layer (0<x<1) has the band gap smaller than that of the AlN layer, the $Al_XGa_{1-X}N$ layer can emit the light of the ultraviolet band. The GaN layer has the band gap of 3.4 eV smaller than that of the $Al_XGa_{1-X}N$ layer (0<x<1), and the $In_YGa_{1-X}N$ layer (0<x<1) has the band gap smaller than that of the GaN layer and emits the light of the visible band. The InN layer has the band gap of 0.7 eV smaller than that of the $In_YGa_{1-X}N$ layer (0<x<1) and emits the light of the infrared band.

Preferably, the first compound semiconductor layer 11 is grown through the MOCVD, MBE (molecular beam epitaxy) or HVPE (hydride vapor phase epitaxy).

According to the MOCVD scheme, the substrate 10 is loaded into the reactor and reactive precursors are injected into the reactor by carrier gas. Then, the reactive precursors are subject to chemical reaction under the predetermined pressure and temperature, thereby growing the first compound semiconductor layer 11. If the compound semiconductor layer is the nitride-based semiconductor layer, the reactive precursors may include TMAl, TMGa, TEGa or $GaCl_3$. In addition, $NH_3$, nitrogen, or $N(C_4H_9)H_2$ can be used as nitride source gas. Preferably, the temperature of the reactor is 900 to 1150° C. and the pressure of the reactor is $10^{-5}$-2000 mmHg.

The procedure for forming the GaN layer through the MOCVD scheme can be expressed by the following reaction formula 1.

[Reaction Formula 1]

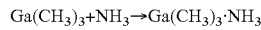

$$Ga(CH_3)_3 + NH_3 \rightarrow Ga(CH_3)_3 \cdot NH_3$$

The $Ga(CH_3)_3 \cdot NH_3$ can be created by injecting the $Ga(CH_3)_3$ and $NH_3$.

The $Ga(CH_3)_3 \cdot NH_3$ is thermally decomposed on the substrate, so that the GaN layer is formed according to the following reaction formula 2.

[Reaction Formula 2]

$$Ga(CH_3)_3 \cdot NH_3 \rightarrow GaN + nCH_4 + \frac{1}{2}(3-n)H_2$$

The first compound semiconductor layer 11 is grown in the form of a cluster or an island on the buffer layer and absorbed in the substrate (buffer layer). Finally, the first compound semiconductor layer 11 is grown in the form of a planar layer. When the first compound semiconductor layer 11 having the desired thickness has been grown, the substrate 10 is unloaded from the reactor and particles 12, which are previously prepared, are coated on the first compound semiconductor layer 11. The particles 12 may include balls having spherical shapes. The particles 12 can be prepared by using various materials, such as $SiO_2$, $Al_2O_3$, $TiO_2$, $ZrO_2$, $Y_2O_3$-$ZrO_2$, CuO, $Cu_2O$, $Ta_2O_5$, PZT(Pb(Zr, Ti)$O_3$), $Nb_2O_5$, $FeSO_4$, $Fe_3O_4$, $Fe_2O_3$, $Na_2SO_4$, $GeO_2$ and CdS. In addition, the size (diameter) of the particle can be variously selected within the range of few nanometer(nm) to tens of micrometer(μm) according to the type and the size of the compound semiconductor device. In general, the GaN layer formed on the GaN substrate used for the light emitting device has the thickness of few micrometer(μm), so the ball preferably has the size of 10 nm to 2 μm. In addition, the SiO2 ball is preferably used as the particle 12 because the $SiO_2$ ball can be conveniently coated on and removed from the first compound semiconductor layer 11.

The $SiO_2$ ball is prepared as follows. First, TEOS (tetraethyl orthosilicate) is dissolved in ethanol absolute to make a first solution. In addition, an ammonia ethanol solution and deionized water are mixed with ethanol to make a second solution. The ammonia serves as a catalyst to form the particles. Then, the first solution is mixed with the second solution, and the mixed solution is stirred for a predetermined time under the predetermined temperature, thereby forming the spherical $SiO_2$ ball. Then, the solution containing the particles is subject to centrifugal separation, so that the particles are separated from the solution. The particles are cleaned by ethanol and the cleaned particles are distributed into the ethanol solution, thereby obtaining the solution containing the particles similar to slurry. The size of the particle can be adjusted according to manufacturing conditions, such as the reaction time, temperature, and amount of reactive materials. Meanwhile, applicant of the subject application has suggested "method for growing a compound semiconductor layer on a substrate coated with particles" (Korean Patent application No. 10-2005-0019605 filed in Mar. 9, 2005 and Korean unexamined patent publication No. 10-2006-0098977 issued in Sep. 19, 2006). The method for manufacturing the $SiO_2$ ball is disclosed in the above application in detail.

Then, the solution containing the particles 12 is coated on the substrate formed with the first compound semiconductor layer 11 through dropping, dipping or spin coating. At this time, density of the particles 12 on the substrate can be variously adjusted by controlling the coating time and coating frequency. Preferably, as shown in FIG. 1, the particles 12 are not densely distributed on the first compound semiconductor layer 11 such that the first compound semiconductor layer 11 can be properly exposed. Semiconductor rods 20 are formed by using the particles 12 and metal layer 30 is formed on the surface of the substrate 10 exposed between the particles 12, which will be described later in detail. Preferably, the metal layer 30 is connected to each other to reduce electric resistance. In addition, the metal layer 30 reflects the light, which is emitted from an active layer 52 and guided toward the substrate 10. In this regard, the metal layer 30 must have a sufficient area to increase the quantity of light reflected from the metal layer 30. If the particles 12 are roughly coated on the first compound semiconductor layer 11, the growth time for a second compound semiconductor layer 40, which is grown from lateral sides of the semiconductor rods 20, is lengthened. Therefore, the density of the particles 12 is properly adjusted by taking the light emitting efficiency of the semiconductor light emitting device and the growth rate of the second compound semiconductor layer 40 into consideration.

Figure 2:
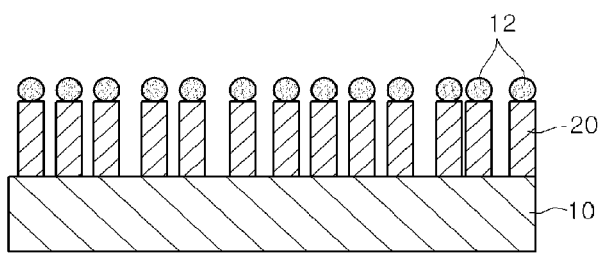

Referring to FIG. 2, the semiconductor rods 20 are formed by etching the first compound semiconductor layer 11 using the coated particles 12 as a mask. The semiconductor rods 20 may have an island shape. That is, semiconductor rod 20 forms a semiconductor island. In addition, the semiconductor rods 20 may have column shape. That is, the semiconductor rod 20 forms a semiconductor column. In addition, the semiconductor rods 20 may have a cylindrical shape. That is, the embodiment employs the particles 12 as an etch mask without performing the photolithography process using an expensive photo mask. Thus, the embodiment can simply form the semiconductor rods 20 having the diameter identical to that of the particles 12 at the low cost. At this time, density of the semiconductor rods 20 is identical to coating density of the particles.

The particles 12 can be randomly arranged on the first compound semiconductor layer 11. In other words, the particles 12 are irregularly arranged on the first compound semiconductor layer 11. In this case, the semiconductor rods 20 are also randomly formed. The semiconductor rods 20 are randomly formed on the substrate 10. That is, the semiconductor rods 20 are spaced apart from each other at irregular intervals. In addition, the position, the number and/or the shape of the semiconductor rods 20 may vary in the semiconductor light emitting device according to the embodiment. As shown in FIG. 2, the first compound semiconductor layer 11 is etched until the top surface of the substrate 10 is exposed. On the contrary, the first compound semiconductor layer 11 can be etched such that the top surface of the substrate 10 is not exposed in order to form the semiconductor rods 20.

A dry etching is preferably employed as an etching scheme because the dry etching represents superior etching anisotropy. In detail, RIE (reactive ion etching) or plasma etching, such as ICP (inductively coupled plasma) and TCP (transformer coupled plasma), can be employed. Typical etching gas suitable for the material of the first compound semiconductor layer 11 can be used. For instance, $BCl_3$ or $Cl_2$ can be used as the etching gas if the first compound semiconductor layer 11 includes the GaN. In addition, process conditions, such as the etching time, process pressure and temperature, are determined by taking into consideration the etching method, etching depth and etching rate according to the height of the semiconductor rods 20. The semiconductor rods 20 may have the height of about 0.5 to 5.0 μm, but the embodiment is not limited thereto.

Figure 6:
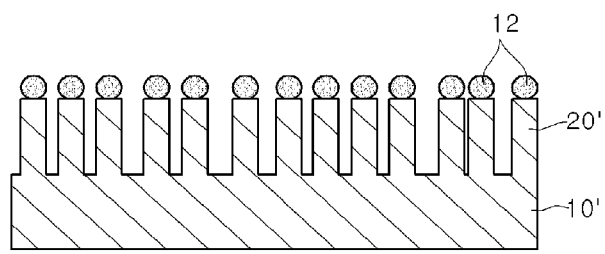
FIGS. 6 and 7 are sectional views showing a method of manufacturing a semiconductor light emitting device according to another embodiment.

Although it has been described that the first compound semiconductor layer 11 is formed on the substrate 10 and the semiconductor rods 20 are formed by etching the first compound semiconductor layer 11 toward the substrate, the embodiment is not limited thereto. That is, as shown in FIG. 6, the particles 12 can be directly coated on a substrate 10' without forming the first compound semiconductor layer 11. In this case, a semiconductor rods 20' having the material identical to that of the substrate 10' can be formed by etching the substrate 10' at a predetermined depth using the particles 12 as an etch mask. At this time, the dry etching used for etching the first compound semiconductor layer 11 can be employed to etch the substrate 10'. Since the material of the etch target is changed, the etching gas and the process conditions may be slightly changed. For instance, $SF_6$ or $C4F_8$ can be used as the etch gas if the substrate 10' includes silicon.

After that, the metal layer 30 is deposited on the substrate 10 between the semiconductor rods 20. It is not necessary to employ the epitaxial growth scheme having complicated process conditions to form the metal layer 30. The sputtering scheme or the evaporation scheme can be adopted in terms of productivity. The sputtering scheme is preferred because it represents superior deposition anisotropy. The metal layer 30 can prevent the light, which is emitted from the active layer 52, from being absorbed in the substrate 10. The metal layer 30 serves as reflective layers for reflecting the light toward the surface of the light emitting device. Since the metal layer 30 serves as an electrode of the light emitting device, the metal layer 30 must have superior reflectivity and reduced electric resistance. For instance, the metal layer 30 may include Pt, Au, Ta, Ti, Cr, Al, Cu or an alloy thereof. In addition, the metal layer 30 can be prepared in the form of at least two layers using two different metals. In this case, each metal layer can be deposited through the same or different deposition scheme.

Figure 3:
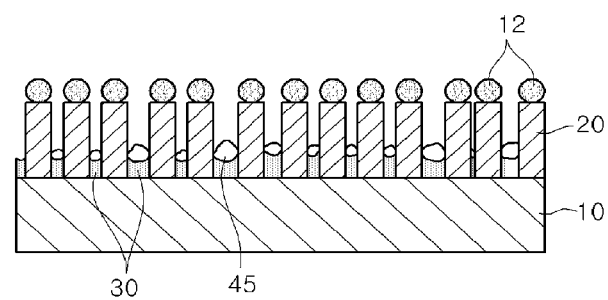

The metal layer 30 has the thickness sufficient for reflecting the light. In addition, the thickness of the metal layer 30 must be smaller than the height of the semiconductor rods 20 in such a manner that the second compound semiconductor layer 40 can be grown from the lateral sides of the semiconductor rods 20 exposed above the metal layer 30. For instance, the metal layer 30 may have the thickness in the range of several tens to several hundreds nanometers. As shown in FIG. 3, the metal layer 30 is mainly deposited on the substrate 10 between the semiconductor rods 20 in comparison with the lateral sides of the semiconductor rods 20 and the surface of the particles 12. The deposition thickness of the metal layer 30 becomes high at the lower periphery of the semiconductor rods 20, so that the metal layer 30 has slightly concave shapes.

The heat treatment process can be performed with respect to the metal layer 30. That is, the rapid thermal process is performed with respect to the metal layer 30 under the ammonia atmosphere or nitrogen atmosphere for several seconds to several tens of seconds at the temperature of 300 to 600° C. (less than the melting point of metal of the metal layer). Due to the heat treatment process, the metal layer may reflow so that the surface of the metal layer is planarized. Thus, reflectivity of the metal layer can be improved. In addition, the metal layer 30 can be stabilized through the heat treatment process, so that the metal layer 30 can be prevented from being oxidized and delaminated in the subsequent processes.

Figure 4:
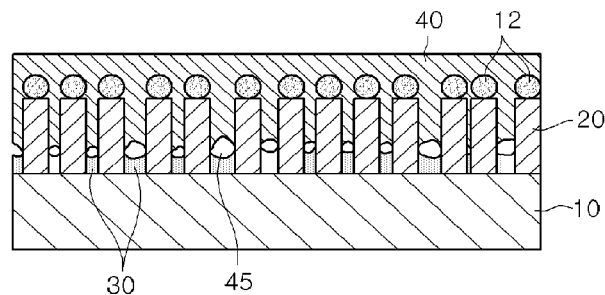

Then, as shown in FIG. 4, the compound semiconductor is grown from the lateral sides of the semiconductor rods 20, so that the second compound semiconductor layer 40 is formed while covering the semiconductor rods 20 and the particles 12. Similar to the first compound semiconductor layer 11, the second compound semiconductor layer 40 can be formed through the MOCVD scheme. However, different from the first compound semiconductor layer 11 that is grown from the whole surface area of the substrate 10, the second compound semiconductor layer 40 is grown from the lateral sides of the semiconductor rods 20 exposed above the metal layer 30. For instance, the first compound semiconductor layer 11 is grown through the PE (pendeo-epitaxy) growth mechanism.

The PE growth scheme is basically identical to the ELO scheme. According to the ELO scheme, a mask is formed on a planar semiconductor layer such that the semiconductor layer is partially exposed through the mask and then the compound semiconductor is grown. At first, the compound semiconductor is vertically grown from the exposed semiconductor layer. Then, the compound semiconductor horizontally expands on the mask while being combined with each other, so that the compound semiconductor layer is formed. However, according to the PE growth scheme, since spaces are formed between the semiconductor rods 20 as shown in FIG. 3, the compound semiconductor is horizontally grown from the lateral sides of the semiconductor rods 20. Then, the compound semiconductor is combined with each other and grown vertically to the substrate. After that, the compound semiconductor horizontally expands above the particles 12, so that the compound semiconductor is combined again, thereby forming the second compound semiconductor layer 40. Since the compound semiconductor is rarely grown on the metal layer 30 formed between the semiconductor rods 20, a porous layer 45 can be formed at the boundary area between the metal layer 30 and the second compound semiconductor layer 40. In addition, the metal layer 30 arranged at a region having no porous layer 45 may directly make contact with the second compound semiconductor layer 40. When the light emitting device has been manufactured, the porous layer 45 can improve the reflectivity of the light, which is emitted from the active layer 52 and guided toward the substrate 10, because the porous layer 45 causes difference in refractive index between mediums, so that the light emitting efficiency of the light emitting device can be improved.

According to the embodiment, the second compound semiconductor layer 40 may have various features. For instance, the second compound semiconductor layer 40 can be prepared as a single-layer structure by using the same material, or a multi-layer structure by using different materials. In addition, when the compound semiconductor layer is deposited, at least one material selected from the group consisting of Si, Ge, Mg, Zn, O, Se, Mn, Ti, Ni and Fe is injected such that the compound semiconductor layer may have a heterogeneous material. The user can selectively add the heterogeneous material through in-situ doping, ex-situ doping or ion implantation in order to change the electrical, optical or magnetic characteristics of the compound semiconductor layer.

According to the in-situ doping, the heterogeneous material is added when the semiconductor layer is grown. According to the ex-situ doping, the heterogeneous material is injected into the compound semiconductor layer through the heat treatment or plasma treatment after the compound semiconductor layer has been grown.

According to the ion implantation, the heterogeneous material is accelerated to collide with the compound semiconductor layer, so that the heterogeneous material is injected into the semiconductor layer.

In addition, after the compound semiconductor layer has been formed according to the embodiment, a thicker compound semiconductor layer can be deposited through the HVPE (hydride vapor phase epitaxy) scheme by employing the compound semiconductor layer as a substrate. The HVPE scheme is a kind of vapor phase growth schemes, in which gas is supplied onto a substrate to grow crystal on the substrate through gas reaction. If the thicker compound semiconductor layer is formed through the HVPE scheme, the high-quality compound semiconductor layer uniformly grown on the substrate can be selectively used by separating the substrate from the compound semiconductor layer or removing the substrate through polishing or etching.

In order to form the thicker compound semiconductor layer, that is, the thicker GaN layer through the HVPE scheme, a container having Ga metal therein is loaded into a reactor and the container is heated by a heater installed around the reactor, thereby making a Ga solution. The Ga solution reacts with HCl, thereby generating GaCl gas as expressed in the following reaction formula 3.
[Reaction Formula 3]

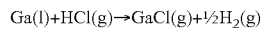

If the GaCl gas reacts with the NH$_3$, the GaN layer is formed according to the following reaction formula 4.
[Reaction Formula 4]

At this time, non-reacted gas is exhausted according to the following reaction formula 5.
[Reaction Formula 5]

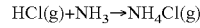

The HVPE scheme can grow the thicker layer at the growth rate of 100 μm/hr, so the productivity can be improved.

Figure 7:
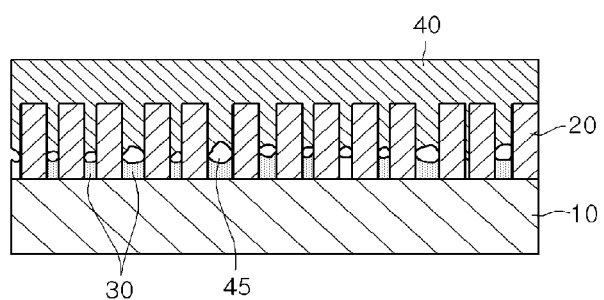

Meanwhile, although it has been described that the second compound semiconductor layer 40 is grown in a state in which the particles 12 used for forming the semiconductor rods 20 have been coated on the semiconductor rods 20, the embodiment is not limited thereto. That is, as shown in FIG. 7, after forming the semiconductor rods 20 or depositing the metal layer 30, the second compound semiconductor layer 40 can be grown in a state in which the particles 12 have been removed.

The particles 12 have no great adhesive force relative to the semiconductor rods 20, that is, the first compound semiconductor layer 11. Thus, the particles 12 can be simply removed through an ultrasonic cleaning. The particles 12 can also be removed through a chemical etching. For instance, if the particles 12 include oxide silicon, the particles 12 can be removed through a wet etching by dipping the substrate in the HF solution.

Figure 5:
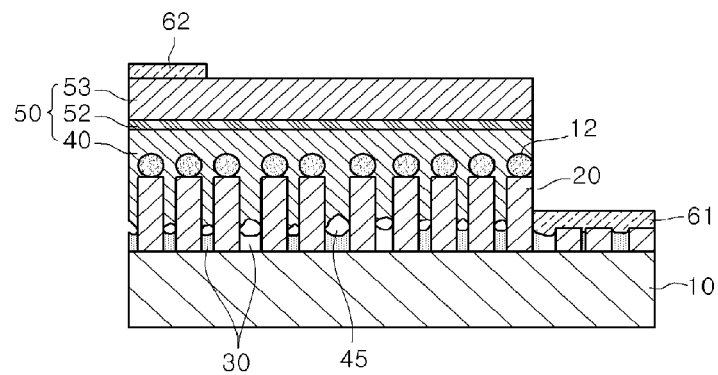

Then, referring to FIG. 5, the active layer and the second conductive type compound semiconductor layer are formed on the second compound semiconductor layer 40. According to the embodiment, the second compound semiconductor layer 40 is a first conductive type semiconductor layer. The first conductive type signifies an N type and the second conducive type signifies a P type. The semiconductor light emitting device according to the embodiment is a light emitting diode having an N-type layer, an active layer and a P-type layer.

On the contrary, the second compound semiconductor layer 40 may have the N-type layer, the active layer and the P-type layer. In addition, in a state in which the first conductive type semiconductor layer is formed on the second compound semiconductor layer 40, the active layer and the second conductive type compound semiconductor layer can be sequentially formed on the first conductive type semiconductor layer.

For instance, the second compound semiconductor layer 40 is an n-GaN layer, and the second conductive type compound semiconductor layer 53 is a p-GaN layer. In addition, the active layer 52 is an InGaN layer having a quantum well structure or a multiple quantum well structure.

Then, predetermined portions of the second conductive type compound semiconductor layer 53, the active layer 42, and the second compound semiconductor layer 40 are sequentially patterned and the exposed particles 12 and semiconductor rods 20 are etched, thereby exposing a part of the metal layer 30.

After that, a conductive material is deposited on the exposed metal layer 30 and the conductive material is patterned to form a first electrode 61. In addition, a second electrode 62 is formed on the second conductive type compound semiconductor layer 53. For instance, the conductive material includes metal, such as Ni or Au, which is extensively used as an electrode for the light emitting device, an alloy thereof or transparent metal oxide, such as ITO.

That is, the semiconductor rods 20 are arranged on the substrate 10 while being spaced apart from each other. The metal layer 30 has concave surfaces. The metal layer 30 can be directly connected to the second compound semiconductor layer 40. The metal layer 30 has the thickness smaller than that of the semiconductor rods 20. That is, the metal layer 30 is filled between the semiconductor rods 20 such that lateral sides of the semiconductor rods 20 can be partially exposed.

The second compound semiconductor layer 40 is aligned between and on the semiconductor rods 20. The second compound semiconductor layer 40 is doped with a first conductive type dopant. The second compound semiconductor layer 40 may be an N type semiconductor layer. The N type semiconductor layer may include III-V group compound, such as a semiconductor material having the composition formula of $In_XAl_YGa_{1-X-Y}N$ ($0 \leq x \leq 1$, $0 \leq y \leq 1$, $0 \leq x+y \leq 1$). For instance, the N type semiconductor layer may include at least one of GaN, InN, AlN, InGaN, AlGaN, InAlGaN, and AlInN. The first conductive type dopant is an N type dopant that may include Si, Ge, or Sn. The active layer 52 is formed on the second compound semiconductor layer 40. The active layer 52 has a single quantum well structure or a multiple quantum well structure. The active layer 52 may have a period of an InGaN well layer and an AlGaN barrier layer or a period of an InGaN well layer and a GaN barrier layer. A light emitting material of the active layer 52 may vary depending on the wavelength of light, such as blue wavelength, red wavelength and green wavelength.

A conductive clad layer can be formed above and/or below the active layer 52. The conductive clad layer may include an AlGaN layer.

The second conductive type compound semiconductor layer 53 can be formed on the active layer 52. The second conductive type compound semiconductor layer 53 is doped with a second conductive type dopant. In addition, the second electrode 62 makes contact with the top surface of the second conductive type compound semiconductor layer 53. The second conductive type compound semiconductor layer 53 may be a P type semiconductor layer. The P type semiconductor layer may include III-V group compound, such as a semiconductor material having the composition formula of $In_XAl_YGa_{1-X-Y}N$ ($0 \leq x \leq 1$, $0 \leq y \leq 1$, $0 \leq x+y \leq 1$). For instance, the P type semiconductor layer may include at least one of GaN, InN, AN, InGaN, AlGaN, InAlGaN, and AlInN. The second conductive type dopant is a P type dopant that may include Mg, Zn, Ca, Sr, Ba or II-group element.

The second compound semiconductor layer 40, the active layer 52 and the second conductive type compound semiconductor layer 53 constitute a light emitting structure 50. The light emitting structure 50 may have an N-P junction structure, an N-P-N junction structure, a P-N junction structure or a P-N-P junction structure. That is, the first conductive type may be a P type and the second conductive type may be an N type. In addition, the N-type or P-type semiconductor layer can be deposited on the second compound semiconductor layer 40.

As mentioned above, since the metal layer 30 is connected to each other when viewed in a plan view, the metal layer 30 is electrically connected to the first electrode (electrode pad) 61 so that the metal layer 30 may serve as the electrode for the second compound semiconductor layer 40. Thus, electric resistance of the electrode is significantly reduced, so power consumption can be reduced. In addition, the metal layer 30, together with the porous layer 45, can reflect the light, which is emitted from the active layer 52 and guided toward the substrate 10, toward the surface of the light emitting device (that is, toward the second conductive type compound semiconductor layer 53), so that the amount of light absorbed in the substrate 10 can be reduced, thereby significantly improving the light emitting efficiency of the light emitting device.

According to the method of manufacturing the semiconductor device of the embodiment, the first compound semiconductor layer 11, which is deposited on the substrate 10 by using the particles 12 as an etch mask, is etched to form a plurality of semiconductor rods 20.

Then, the metal layer 30 is deposited between the semiconductor rods 20 and the second compound semiconductor layer 40 is grown from the lateral sides of the semiconductor rods 20 exposed above the metal layer 30.

Therefore, the method of manufacturing the semiconductor device according to the embodiment can simply manufacture the high-quality semiconductor light emitting device at the low cost with high reproducibility and high product yield as compared with the conventional ELO scheme employing the photolithography process. In addition, according to the semiconductor light emitting device of the embodiment, resistance of the second compound semiconductor layer 40 can be reduced and the electric characteristics of the second compound semiconductor layer 40 can be improved due to the metal layer 30.

Further, since the metal layer 30 serves as a reflective layer, the light emitting efficiency of the light emitting device according to the embodiment can be improved.

In addition, since the contact area between the semiconductor rods 20 and the substrate 10 can be reduced, the defect of the second compound semiconductor layer 40 of the semiconductor light emitting device according to the embodiment can be reduced. That is, the semiconductor rods 20 serve as buffers to compensate for crystallographic difference between the substrate 10 and the second conductive type semiconductor layer 40. Thus, the crystal defect of the semiconductor device according to the embodiment can be reduced.

The semiconductor device and the light emitting device according to the embodiment have improved performance and can be easily manufactured.

Any reference in this specification to "one embodiment", "an embodiment", "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

The semiconductor device, the light emitting device and the method of manufacturing the same according to the embodiment can be used in the field of the semiconductor device and the light emitting device.

What is claimed is:

1. A semiconductor device comprising:
a substrate;
a plurality of rods aligned on the substrate, wherein the rods are formed from a first compound semiconductor;
a plurality of particles disposed on the rods;
a metal layer disposed on the substrate and filled etched area between the rods;
a second compound semiconductor layer contacted on the metal layer, the rods, and the plurality of particles, wherein a height of the metal layer from the substrate is smaller than a height of the rods from the substrate; and
an electrode connected to the metal layer, wherein each of the areas between the rods are connected to each other, and the metal layer is electrically connected to the electrode, and a porous layer is formed at a boundary area between the metal layer and the second compound semiconductor layer.

2. The semiconductor device of claim 1, wherein the particles are disposed between at least a portion of the second semiconductor layer and a portion of the rods.

3. The semiconductor device of claim 2, wherein the particles include silicon oxide, sapphire, titanium oxide, zirconium oxide, Y2O3-ZrO2, copper oxide, tantalum oxide, Pb(Zr,Ti)O3, niobium oxide, FeSO4, iron oxide, sodium sulfite, GeO2, or CdS.

4. The semiconductor device of claim 1, wherein the rods are randomly aligned on the substrate.

5. The semiconductor device of claim 1, wherein the first compound semiconductor includes GaN, InN, AN, lnGaN, AlGaN, AllnN or AllnGaN.

6. The semiconductor device of claim 1, wherein the second compound semiconductor layer is doped with Si, Ge, Mg, Zn, O , Se, Mn, Ti, Ni or Fe.

7. The semiconductor device of claim 1, wherein the metal layer includes Pt, Au, Ag, Ta, Ti, Cr, Al, Cu or an alloy thereof.

8. The semiconductor device of claim 1, wherein each rod has a diameter of about 10 nm to 2 µm.

9. The semiconductor device of claim 1, wherein the metal layer surrounds a side surface of the respective rods.

10. A semiconductor device comprising:
a substrate;
a plurality of rods aligned on the substrate, wherein the rods are formed from a first compound semiconductor;
a plurality of particles disposed on the rods;
a metal layer disposed on the substrate and filled etched area between the rods;
a second compound semiconductor layer above the metal layer and contacting the rods and the plurality of particles, wherein a height of the metal layer from the substrate is smaller than a height of the rods from the substrate; and
an electrode connected to the metal layer, wherein each of the areas between the rods are connected to each other, and the metal layer is electrically connected to the electrode, and a porous layer is formed at a boundary area between the metal layer and the second compound semiconductor layer.

* * * * *